United States Patent
Park

(10) Patent No.: US 10,285,268 B2
(45) Date of Patent: May 7, 2019

(54) PRINTED CIRCUIT BOARD AND METHOD OF MANUFACTURING THE SAME

(71) Applicant: LG INNOTEK CO., LTD., Seoul (KR)

(72) Inventor: Gi Gon Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 8 days.

(21) Appl. No.: 15/606,102

(22) Filed: May 26, 2017

(65) Prior Publication Data

US 2017/0347450 A1  Nov. 30, 2017

(30) Foreign Application Priority Data

May 27, 2016  (KR) .................. 10-2016-0065589

(51) Int. Cl.
*H05K 1/09*     (2006.01)
*H05K 1/11*     (2006.01)
*H05K 1/03*     (2006.01)
*H05K 3/00*     (2006.01)
*H05K 3/40*     (2006.01)
*H05K 3/46*     (2006.01)
*H05K 3/38*     (2006.01)
*H05K 3/42*     (2006.01)
*H05K 3/10*     (2006.01)

(52) U.S. Cl.
CPC ............ *H05K 1/09* (2013.01); *H05K 1/0353* (2013.01); *H05K 1/112* (2013.01); *H05K 1/115* (2013.01); *H05K 3/0011* (2013.01); *H05K 3/388* (2013.01); *H05K 3/4038* (2013.01); *H05K 3/422* (2013.01); *H05K 3/4644* (2013.01); *H05K 1/11* (2013.01); *H05K 3/108* (2013.01); *H05K 3/4069* (2013.01); *H05K 3/4076* (2013.01); *H05K 3/423* (2013.01); *H05K 2201/09509* (2013.01)

(58) Field of Classification Search
CPC ........ H05K 1/09; H05K 1/0353; H05K 1/115; H05K 3/4038; H05K 3/4644; H05K 3/0011; H05K 2201/09509
See application file for complete search history.

(56) References Cited

U.S. PATENT DOCUMENTS

| | | | | |
|---|---|---|---|---|
| 6,015,749 A | * | 1/2000 | Liu | H01L 21/76843 257/E21.584 |
| 6,797,608 B1 | * | 9/2004 | Lin | H01L 21/76846 438/627 |
| 8,981,234 B2 | * | 3/2015 | Ohmi | H05K 3/381 174/256 |
| 2009/0133910 A1 | * | 5/2009 | Ohashi | H05K 3/0032 174/258 |
| 2010/0065315 A1 | * | 3/2010 | Kimura | B32B 15/08 174/258 |
| 2010/0326709 A1 | * | 12/2010 | Kawano | H05K 3/388 174/257 |
| 2012/0161323 A1 | * | 6/2012 | Kim | H01L 23/498 257/753 |

\* cited by examiner

*Primary Examiner* — Ishwarbhai B Patel
(74) *Attorney, Agent, or Firm* — LRK Patent Law Firm

(57) ABSTRACT

A printed circuit board (PCB) includes: a substrate; and a circuit pattern disposed on the substrate, wherein the circuit pattern includes a first seed layer disposed on the substrate and including a nitride, and a metal layer disposed on the first seed layer.

4 Claims, 4 Drawing Sheets

PRINTED CIRCUIT BOARD AND METHOD OF MANUFACTURING THE SAME

CROSS-REFERENCE TO RELATED APPLICATION(S)

The present application claims priority under 35 U.S.C. 119 and 35 U.S.C. 365 to Korean Patent Application No. 10-2016-0065589, filed on May 27, 2016, which is hereby incorporated by reference in its entirety.

BACKGROUND

1. Field of the Invention

The embodiment relates to a printed circuit board (PCB), and more particularly, to a PCB including a circuit pattern formed of a seed layer of a nitride metal layer and a method of manufacturing the same.

2. Description of Related Art

Recently, as a substrate serving as an interposer between a substrate and an electronic device has rapidly become light and thin, a high density and a fine pattern have been demanded. Various efforts have been made to shorten an existing process as well as improvement of technology.

An additive method is used for forming a circuit pattern of a PCB. The additive method forms the circuit pattern on an insulating layer by a plating method. Recently, a semi-additive method is used for more effective plating. The semi-additive method increases roughness by surface-treating the insulating layer and forms a seed layer as a base layer for electroplating through chemical plating. After forming the seed layer, the circuit pattern is completed by electroplating until the thickness of the circuit pattern reaches a certain level.

A conventional semi-additive method requires a surface roughness treatment process and a thickness of 10000 Å or more in order to form a uniform a seed layer on the entire substrate. If the thickness of the seed layer is thick, the lead time of a flesh etching process for removing the seed layer becomes long and it is difficult to form a fine pitch.

SUMMARY

The embodiment provides a printed circuit board (PCB) having a new structure and a method of manufacturing the same.

The embodiment provides a PCB capable of improving a bonding force between a substrate and a metal layer by forming a circuit pattern on a metal layer including a nitride as a seed layer and a method of manufacturing the same.

The objectives of the present invention are not limited to the above, and other objectives will be clearly understood to those skilled in the art from the following descriptions.

According to the embodiment, there is provided a PCB including: a substrate; and a circuit pattern disposed on the substrate, wherein the circuit pattern includes a first seed layer disposed on the substrate and including a nitride, and a metal layer disposed on the first seed layer.

Further, the first seed layer includes at least one of titanium nitride (TiN), nickel nitride (NiN), copper nitride (CuN), molybdenum nitride (MoN), tantalum nitride (TaN), and chromium nitride (CrN).

Furthermore, the first seed layer has a thickness in the range of 10 nm to 70 nm.

In addition, the circuit pattern further includes a second seed layer disposed between the first seed layer and the metal layer.

Further, the second seed layer includes a metal material of at least one of copper and nickel.

Furthermore, the second seed layer has a thickness in the range of 200 nm to 400 nm.

In addition, an insulating resin including at least one of epoxy and cyanate is disposed on a surface of the substrate.

Further, the substrate includes a via hole formed on at least one surface of the substrate, and the first seed layer is disposed on an inner wall of the via hole.

Furthermore, the circuit pattern includes a first portion buried in the via hole of the substrate, and a second portion disposed over the first portion and protruding above the surface of the substrate.

In addition, a width of the first portion is narrower than that of the second portion.

Meanwhile, there is provided a method of manufacturing a PCB including: forming a first seed layer including a nitride on a surface of a substrate; forming a second seed layer including a metal material on the first seed layer; forming a dry film having an opening corresponding to a circuit pattern formed on the second seed layer; forming a metal layer on a surface of the second seed layer exposed through the opening by electroplating; removing the dry film; and removing the first and second seed layers exposed on the surface of the substrate.

Further, the first seed layer includes at least one of titanium nitride (TiN), nickel nitride (NiN), copper nitride (CuN), molybdenum nitride (MoN), tantalum nitride (TaN), and chromium nitride (CrN).

Furthermore, the first seed layer has a thickness in the range of 10 nm to 70 nm.

Further, the second seed layer includes a metal material of at least one of copper and nickel.

Furthermore, the second seed layer has a thickness in the range of 200 nm to 400 nm.

In addition, an insulating resin including at least one of epoxy and cyanate is disposed on the surface of the substrate.

Further, the method further includes forming a via hole formed on at least one surface of the substrate, and the first seed layer is disposed on an inner wall of the via hole.

Furthermore, the circuit pattern includes a first portion buried in the via hole of the substrate, and a second portion disposed over the first portion and protruding above the surface of the substrate.

In addition, a width of the first portion is narrower than that of the second portion.

According to the embodiment, in order to form a fine pattern, the adhesion force of a circuit pattern even in a narrow area is required to be maximized. By forming the circuit pattern based on the metal layer including a nitride, the adhesion between the circuit pattern and the insulating resin can be maximized without a separate surface roughness treatment process.

In addition, according to the embodiment, the difference due to a thermal shock can be minimized as the deviation between the metal seed layer and the insulating resin layer is reduced due to a difference in thermal expansion coefficients.

The details of one or more embodiments are set forth in the accompanying drawings and the description below. Other features will be apparent from the description and drawings, and from the claims.

BRIEF DESCRIPTION OF THE DRAWINGS

Embodiments will be described in detail with reference to the following drawings in which like reference numerals refer to like elements, and wherein.

DETAILED DESCRIPTION OF THE EMBODIMENTS

Figure 1:
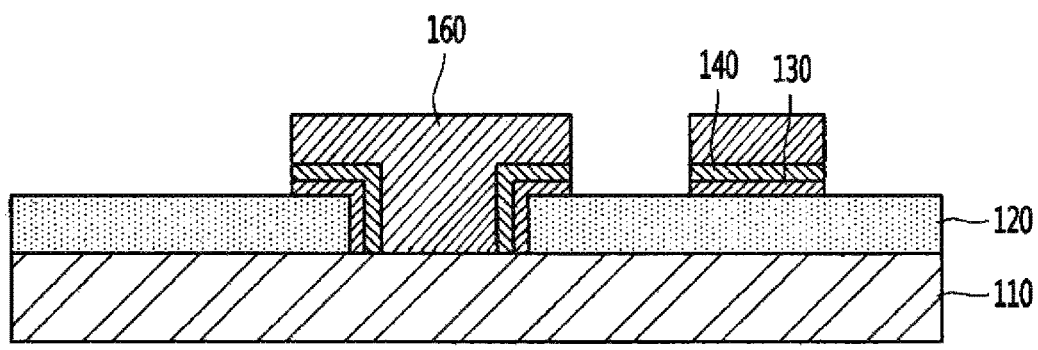
FIG. 1 is a cross-sectional view illustrating a structure of a printed circuit board (PCB) according to an embodiment.

Hereinafter, exemplary embodiments of the present invention that are easily performed by those skilled in the art will be described in detail with reference to the accompanying drawings. However, the present invention may be implemented in various different forms and is not limited to the embodiments described herein.

In the following description, when there is an expression that some portion "includes" some structural elements, this means that some portion does not exclude another structural element, but may further include another structural element unless stated to the contrary.

Further, structures and elements which do not relate to the detail description are not shown in the drawings to clearly describe the present invention, thicknesses may be exaggerated to clearly explain various layers and regions, and similar elements in the following description are designated by similar reference numerals.

It will be understood that when a portion of a layer, a film, a region, a plate or the like is referred to as being "on" another portion, it can be "directly formed on" another portion, or a third portion can be interposed between the portions. Otherwise, when a portion is "directly formed on" another portion, it means that there is no third portion between the portions.

The embodiment provides a new PCB in which a seed layer is formed using a nitride and a circuit pattern is formed based on the formed seed layer, and a method for manufacturing the same.

FIG. 1 is a cross-sectional view illustrating a structure of a printed circuit board (PCB) according to an embodiment.

Referring to FIG. 1, the PCB includes a substrate 110, an insulating resin 120, a first seed layer 130, a second seed layer 140, and a metal layer 160.

The substrate 110 may be a supporting substrate of a PCB on which a single circuit pattern is formed or may refer to an insulating layer region, in which any one of the circuit patterns is formed, of a PCB having a stacked multilayer structure.

When the substrate 110 refers to any one of insulating layers included in the stacked multilayer structure, a plurality of circuit patterns may be consecutively formed on an upper surface or lower surface of the substrate 110.

That is, the substrate 110 is a plate on which an electrical circuit capable of changing wirings is disposed and may include all of printing, a wiring plate, and an insulating substrate which are formed of an insulating material which is able to form a conductive pattern on a surface of the insulating substrate.

The substrate 110 may be rigid or flexible. For example, the substrate 110 may include glass or plastic. Specifically, the substrate 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the substrate 110 may include an optically isotropic film. For example, the substrate 110 may include cyclic olefin copolymer (COC), cyclic olefin polymer (COP), optically isotropic PC, optically isotropic polymethylmethacrylate (PMMA), or the like. Sapphire has excellent electrical properties such as dielectric constant, which not only greatly improves the speed of touch reaction but also may easily realize spatial touch such as hovering and may be applied as a cover substrate because of high surface strength. Here, hovering refers to a technique of recognizing coordinates even at a distance slight away from a display.

Further, the substrate 110 may have a curved surface which is partially bent. That is, the substrate 110 may partially have a plane and may be partially bent having the curved surface. Specifically, an end portion of the substrate 110 may be bent having the curved surface, bent having a surface with a random curvature, or crooked.

Further, the substrate 110 may be a flexible substrate having flexibility. Further, the substrate 110 may be a curved or bent substrate. That is, a product including the substrate 110 may be formed to have a flexible, curved, or bended characteristic. Accordingly, the product including the PCB according to the embodiment is easy to carry, and may be modified to various designs.

Meanwhile, the substrate 110 of the embodiment may be formed of the PCB or a ceramic substrate. Here, the PCB may form a wiring layout for electrical wirings which connect circuit components based on a circuit design, and electrical conductors may be disposed on an insulating material. Further, electrical components may be mounted on the PCB, and the PCB may form wirings configured to connect the electrical components to make a circuit, and may mechanically fix the components besides functioning as electrically connecting the components.

The insulating resin 120 may be optionally formed on the substrate 110.

The insulating resin 120 may be made of a material composed of epoxy and cyanate. Here, since the insulating resin 120 including the epoxy and cyanate has a surface roughness of 0.3 μm or less as compared with a conventional insulating resin using only epoxy and has a low thermal expansion coefficient, and thus has a small expansion and contraction of the substrate, thereby improving reliability even after packaging.

The circuit pattern is formed on the substrate 110.

The circuit pattern includes the first seed layer 130, the second seed layer 140, and the metal layer 160.

The first seed layer 130 includes a nitride and accordingly serves as a functional layer formed to ensure the adhesion with the substrate 110.

In other words, the first seed layer 130 is a seed layer including nitrogen (N). Preferably, the first seed layer 130 may be formed of at least one of titanium nitride (TIN), nickel nitride (NiN), copper nitride (CuN), molybdenum nitride (MoN), tantalum nitride (TaN), and chromium nitride (CrN), or a combination of at least two nitrides.

At this point, the first seed layer 130 may have a thickness in the range of 10 nm to 70 nm. Preferably, the first seed layer 130 is formed to have a thickness of 35 nm.

The first seed layer 130 is formed of a nitride as described above, thereby increasing the bonding force with the substrate 110.

At this point, the first seed layer 130 has a C—N-metal connection ring state such as a bond of carbon and nitrogen and a bond of nitrogen and metal, so that the bonding force with the upper second seed layer 140 may be further enhanced while increasing the bonding force with the lower substrate 110 or the insulating resin 120.

Meanwhile, the insulating resin 120 is disposed on the substrate 110. The insulating resin 120 has an opening for exposing the surface of the substrate 110.

At this point, the first seed layer 130 may be disposed on the insulating resin 120, or alternatively, on the inner wall of the opening of the insulating resin 120.

The second seed layer 140 is disposed on the first seed layer 130.

The second seed layer 140 is a seed layer for forming the metal layer 160 by electroplating. That is, the second seed layer 140 has a function of conducting electricity for electroplating and may be formed of at least one metal of copper and nickel.

The second seed layer 140 may have a thickness ranging from 200 nm to 400 nm and may be formed on the first seed layer 130.

The metal layer 160 is disposed on the second seed layer 140. The metal layer 160 may be formed of a conductive metal material such as copper (Cu), iron (Fe), or an alloy thereof.

As described above, according to the embodiment, the first seed layer 130 including a nitride is used as a seed layer for forming the circuit pattern.

The first seed layer 130 is disposed between the metal and the substrate, and functions to increase the bonding force with the metal and the bonding force with the substrate.

To this end, according to the embodiment, in order to form a fine pattern, the adhesion force of the circuit pattern even in a narrow area is required to be maximized. By forming the circuit pattern based on the metal layer including a nitride, the adhesion between the circuit pattern and the insulating resin can be maximized without a separate surface roughness treatment process.

In addition, according to the embodiment, the difference due to a thermal shock can be minimized as the deviation between the metal seed layer and the Insulating resin layer is reduced due to a difference in thermal expansion coefficients.

Figure 2:
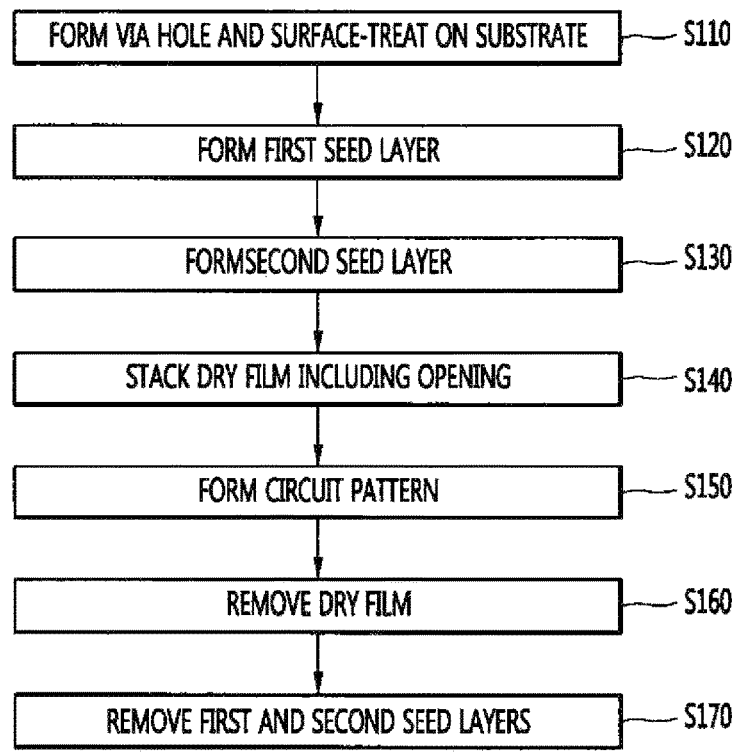
FIG. 2 is a flowchart illustrating steps of a method for manufacturing the PCB according to the embodiment.

FIG. 2 is a flowchart of steps of a method of manufacturing the PCB according to the embodiment of the present invention, and FIGS. 3 to 10 are cross-sectional views illustrating a process sequence of the method of manufacturing the PCB shown in FIG. 1.

Hereinafter, the method of manufacturing the PCB shown in FIG. 1 will be described with reference to FIGS. 2 to 10.

Referring to FIG. 2, first, the substrate 110 is prepared, a via hole 125 is formed in the prepared substrate 110, and a surface of the substrate 110 on which the via hole 125 is formed is subjected to a surface treatment (step 110).

Figure 3:
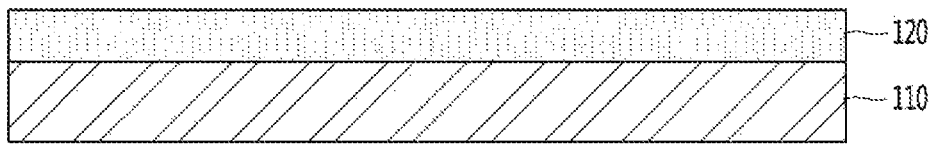
FIGS. 3 to 10 are cross-sectional views of a process sequence for describing the method of manufacturing the PCB shown in FIG. 1.
Figure 4:
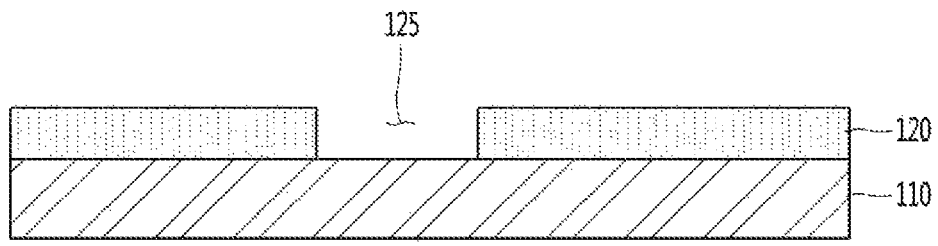

That is, referring to FIG. 3, first, the substrate 110 that is a basis for manufacturing the PCB is prepared.

The substrate 110 may be rigid or flexible. For example, the substrate 110 may include glass or plastic. Specifically, the substrate 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the substrate 110 may include an optically isotropic film. For example, the substrate 110 may include cyclic olefin copolymer (COC), cyclic olefin polymer (COP), optically isotropic PC, optically isotropic polymethylmethacrylate (PMMA), or the like. Sapphire has excellent electrical properties such as dielectric constant, which not only greatly improves the speed of touch reaction but also may easily realize spatial touch such as hovering and may be applied as a cover substrate because of high surface strength. Here, hovering refers to a technique of recognizing coordinates even at a distance slight away from the display.

Further, the substrate 110 may have a curved surface which is partially bent. That is, the substrate 110 may partially have a plane and may be partially bent having the curved surface. Specifically, an end portion of the substrate 110 may be bent having the curved surface, bent having a surface with a random curvature, or crooked.

Further, the substrate 110 may be a flexible substrate having flexibility. Further, the substrate 110 may be a curved or bent board. That is, a product including the substrate 110 may be formed to have a flexible, curved, or bended characteristic. Accordingly, the product including the PCB according to the embodiment is easy to carry, and may be modified to various designs.

Meanwhile, the substrate 110 of the embodiment may be formed of the PCB or a ceramic substrate. Here, the PCB may form a wiring layout for electrical wirings which connect circuit components based on a circuit design, and electrical conductors may be disposed on an insulating material. Further, electrical components may be mounted on the PCB, and the PCB may form wirings configured to connect the electrical components to make a circuit, and may mechanically fix the components besides functioning as electrically connecting the components.

The insulating resin 120 may be optionally formed on the substrate 110.

The insulating resin 120 may be made of a material composed of epoxy and cyanate. Here, since the insulating resin 120 including the epoxy and cyanate has a surface roughness of 0.3 μm or less as compared with a conventional insulating resin using only epoxy and has a low thermal expansion coefficient, and thus has a small expansion and contraction of the substrate, thereby improving the reliability even after packaging.

When the substrate 110 including the insulating resin 120 as described above is prepared, the via hole 125 is formed on the surface of the substrate 110. The via is a path for interlayer electrical connection of the PCB and may be formed by drilling an electrically disconnected layer to form the via hole 125 and filling the via hole 125 with a conductive material or plating the via hole 125 with the conductive material.

The metal material for forming the via hole 125 may be any one selected from Cu, Ag, Sn, Au, Ni, and Pd. The filling of the metal material may be performed by electroless plating, electroplating, screen printing, a sputtering method, an evaporation method, an ink jetting method and a dispensing method, or a combination thereof.

Meanwhile, the via hole 125 may be formed by any one of mechanical, laser, and chemical processing.

When the via hole 125 is formed by mechanical processing, a method such as milling, drilling and routing may be used. When the via hole 125 is formed by laser processing, a method of UV or Co2 laser can be used. And when the substrate 110 is formed by chemical processing, the substrate 110 may be opened using a chemical including aminosilane, ketones, or the like.

Meanwhile, the laser processing is a cutting method in which a part of a material is melted and evaporated by concentrating optical energy on a surface to take a desired shape. Complex formation by a computer program may be easily processed, and composite materials which are difficult to cut by other method may be processed.

In addition, the processing by the laser may have a cutting diameter of at least 0.005 mm, and has a wide range of thickness that may be processed.

As a laser processing drill, yttrium aluminum garnet (YAG) laser, CO2 laser or ultraviolet (UV) laser is preferably used. The YAG laser is a laser capable of processing both a copper foil layer and an insulating layer, and the CO2 laser is a laser capable of processing only an insulating layer.

At this point, the shape of the via hole 125 is as shown in FIG. 3, in which not only the blind via hole 125 blocked at one side thereof, but also a plated through hole passing through the upper and lower surfaces of the substrate 110 may be included. When the via hole 125 is not required, this step may be omitted.

Meanwhile, when the via hole 125 is formed, a deburring process or a desmear process may be performed to remove a drill burr or smear caused by drilling in order to lower a plating defect ratio of the via hole 125.

Then, the surface of the substrate 110 may be surface-treated. Here, the surface treatment may include ion treatment. That is, when the via hole 125 is formed, the surface of the substrate 110 is ion beam processed. The ion beam is a group of molecules or atoms which are charged by a mass of ion flow, and can accelerate the flow of ions as an electric field or a magnetic field is applied. The accelerated ions are in a high energy state and change the electrical properties of the surface of the substrate 110 by contacting such ions to the surface of the substrate 110. Examples of the gas used in the ion beam processing include Ar and nitrogen gas. Meanwhile, the ion beam treatment process is not essential, and since the first seed layer 130 including a nitride is formed as described above in the embodiment, the bonding force with the substrate 110 may be maximized, so that the surface treatment process may be omitted.

Then, when the via hole 125 is formed, the first seed layer 130 is formed on the substrate 110 on which the via hole 125 is formed (step 120).

Figure 5:
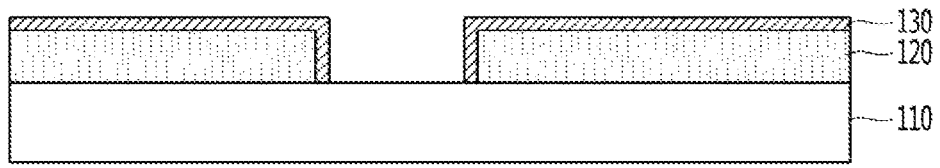

Referring to FIG. 5, the first seed layer 130 is a functional layer that includes a nitride and is formed to secure the adhesion with the substrate 110.

The first seed layer 130 may be formed by sputtering the nitride on the surface of the substrate 110. However, the embodiment is not limited to this, and the first seed layer 130 may be formed by a method other than sputtering.

Sputtering is a technique in which an inert element such as argon is collided with a target (metal plate) to eject metal molecules and then a film is adhered to a surface. Plasma is generated between the substrate to be deposited and the target when a DC power source is applied to the target while an inert gas is being flowed into a sputtering gas in a vacuum chamber. In this plasma, an inert gas is ionized into positive ions by a high-output DC ammeter. The positive ions of the inert gas are accelerated to a negative electrode by the DC ammeter to collide with the surface of the target. The target material in this collision bounced out from the surface by exchanging a momentum due to a complete elastic collision of atoms. When an ion collides with kinetic energy larger than the interatomic bonding energy of a material, this ion bombardment causes the interstitial atoms of the material to be pushed to different positions, which causes the surface escape of atoms. This phenomenon is called sputtering.

At this point, the first seed layer 130 is a seed layer including nitrogen (N). Preferably, the first seed layer 130 may be formed of at least one of titanium nitride (TiN), nickel nitride (NiN), copper nitride (CuN), molybdenum nitride (MoN), tantalum nitride (TaN), and chromium nitride (CrN), or a combination of at least two nitrides.

At this point, the first seed layer 130 may have a thickness in the range of 10 nm to 70 nm. Preferably, the first seed layer 130 is formed to have a thickness of 35 nm.

The first seed layer 130 is formed of a nitride as described above, thereby increasing the bonding force with the substrate 110.

At this point, the first seed layer 130 has a C—N-metal connection ring state such as a bond of carbon and nitrogen and a bond of nitrogen and metal, so that the bonding force with the upper second seed layer 140 may be further enhanced while increasing the bonding force with the lower substrate 110 or the insulating resin 120.

Meanwhile, the insulating resin 120 is disposed on the substrate 110. The insulating resin 120 has an opening for exposing the surface of the substrate 110.

At this point, the first seed layer 130 may be disposed on the insulating resin 120, or alternatively, on the inner wall of the opening of the insulating resin 120.

Then, the second seed layer 140 is formed on the first seed layer 130 (step 130).

Figure 6:
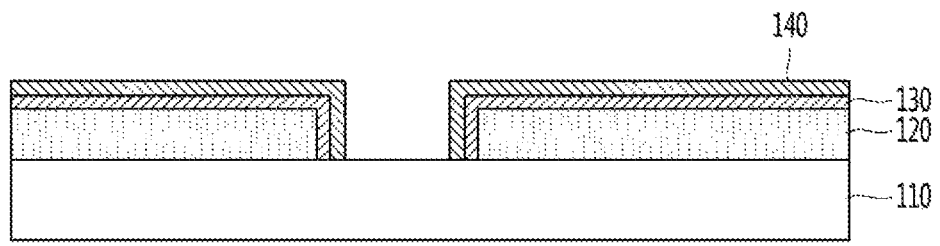

Referring to FIG. 6, the second seed layer 140 is disposed on the first seed layer 130.

The second seed layer 140 is a seed layer for forming the metal layer 160 by electroplating. That is, the second seed layer 140 has a function of conducting electricity for electroplating and may be formed of at least one metal of copper and nickel.

The second seed layer 140 may have a thickness ranging from 200 nm to 400 nm and may be formed on the first seed layer 130.

Then, when the second seed layer 140 is formed, a dry film 150 including an opening is deposited on the second seed layer 140 (step 140).

Figure 7:
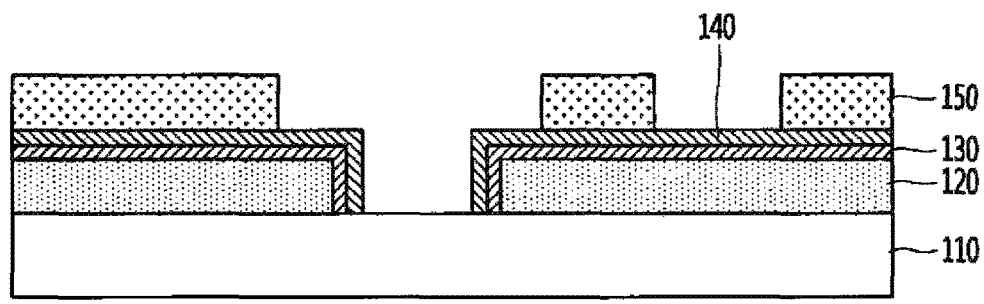

Referring to FIG. 7, the dry film 150 is deposited on the second seed layer 140. The dry film 150 has an opening for opening a portion of the surface of the second seed layer 140 where the metal layer 160 is to be formed.

The metal layer 160 is formed by performing electroplating using the second seed layer 140 in the opening of the dry film 150 (step 150).

Figure 8:
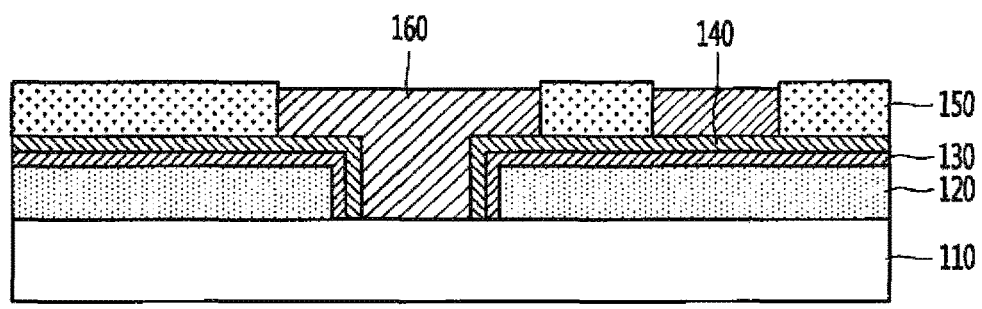

Referring to FIG. 8, the metal layer 160 is disposed on the second seed layer 140. The metal layer 160 may be formed of a conductive metal material such as copper (Cu), iron (Fe), or an alloy thereof.

As described above, in the embodiment, the first seed layer 130 including a nitride is used as a seed layer for forming the circuit pattern.

Figure 9:
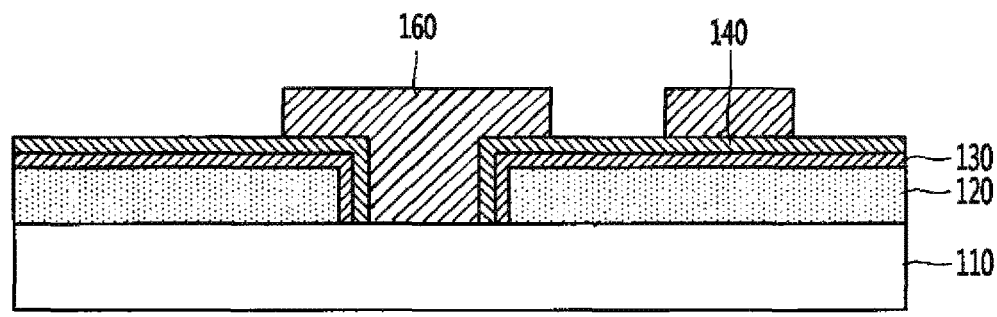

Referring to FIGS. 2 and 9, when the metal layer 160 is formed, the dry film 150 formed on the second seed layer 140 is removed (step 160).

Figure 10:
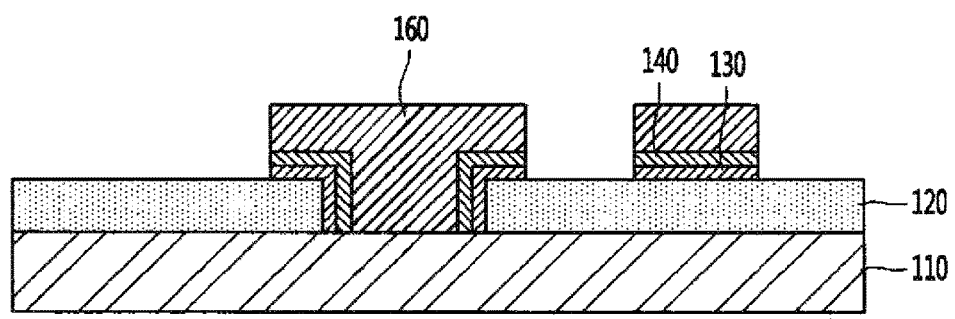

In addition, referring to FIGS. 2 and 10, when the dry film 150 is removed, the second seed layer 140 and the first seed layer 130 exposed on the substrate 110 are removed (step 170).

According to the embodiment, in order to form a fine pattern, the adhesion force of a circuit pattern even in a narrow area is required to be maximized. By forming the circuit pattern based on the metal layer including a nitride, the adhesion between the circuit pattern and the insulating resin can be maximized without a separate surface roughness treatment process.

In addition, according to the embodiment, the difference due to a thermal shock may be minimized as the deviation between the metal seed layer and the insulating resin layer is reduced due to a difference in thermal expansion coefficients.

As described above, the object, constitution, and effects described in the embodiments are included at least one embodiment but are not necessarily limited to one embodiment. Furthermore, the object, constitution, and effects described in each embodiment can be easily modified into other concrete forms by one skilled in the art without changing the technical spirit or the essential features of the present invention. Therefore, it should be understood that all modified or changed forms derived from claims and their equivalents fall within the scope of the present invention.

Although embodiments have been described with reference to a number of Illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A printed circuit board comprising:
a substrate;
an insulating resin disposed on the substrate and including epoxy and cyanate;
a circuit pattern disposed on the insulating resin; and
a via disposed on the substrate and the insulating resin,
wherein each of the circuit pattern and the via includes:
a first seed layer disposed on the insulating resin and including a nitride;
a second seed layer disposed on the first seed layer and including at least one metal material of copper and nickel; and
a metal layer disposed on the second seed layer,
wherein the insulating resin has a surface roughness of 0.3 µm or less,
wherein the insulating resin includes a via hole passing through top and bottom surfaces of the insulating resin,
wherein the first seed layer is disposed on an inner wall of the via hole to expose a top surface of the substrate, and
wherein the top surface of the substrate comprises:
a first portion being in direct contact with the insulating resin;
a second portion being in direct contact with the first seed layer of the via;
a third portion being in direct contact with the second seed layer of the via; and
a fourth portion being in direct contact with the metal layer of the via.

2. The printed circuit board of claim 1, wherein the first seed layer includes at least one of titanium nitride (TiN), nickel nitride (NiN), copper nitride (CuN), molybdenum nitride (MoN), tantalum nitride (TaN), and chromium nitride.

3. The printed circuit board of claim 1, wherein the first seed layer has a thickness in the range of 10 nm to 70 nm.

4. The printed circuit board of claim 1, wherein the second seed layer has a thickness in the range of 200 nm to 400 nm.

* * * * *